US006358668B1

(12) United States Patent
Leenders et al.

(10) Patent No.: US 6,358,668 B1
(45) Date of Patent: Mar. 19, 2002

(54) FLEXOGRAPHIC PRINTING PLATE PRECURSOR COMPRISING AN INK-JET RECEIVING LAYER

(75) Inventors: Luc Leenders; Eddie Daems, both of Herentals; Ronn Andriessen, Beerse; Leo Oelbrandt, Kruibeke, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/615,589

(22) Filed: Jul. 13, 2000

Related U.S. Application Data
(60) Provisional application No. 60/147,381, filed on Aug. 6, 1999.

(30) Foreign Application Priority Data

Jul. 13, 1999 (EP) .............................. 99202291

(51) Int. Cl.[7] .................................. G03F 7/09
(52) U.S. Cl. ................ 430/271.1; 430/281.1; 430/306
(58) Field of Search .................. 430/270.1, 271.1, 430/273.1, 286.1, 306, 325

(56) References Cited

U.S. PATENT DOCUMENTS 4,429,027 A * 1/1984 Chambers, Jr. et al. ......... 430/5
5,035,981 A * 7/1991 Kurtz et al. ................ 430/327
5,709,976 A    1/1998 Malhotra
6,194,125 B1 * 2/2001 Goffing et al. .............. 430/306
6,245,486 B1 * 6/2001 Teng ........................... 430/303

FOREIGN PATENT DOCUMENTS

DE      41 17 127 A1    11/1992
EP         465949 A2 *   1/1992
WO      WO 98/01792      1/1998

* cited by examiner

Primary Examiner—Janet Baxter
Assistant Examiner—Barbara Gilmore
(74) Attorney, Agent, or Firm—Breiner & Breiner, L.L.C.

(57) ABSTRACT

A material is disclosed which is suitable for making a flexographic printing plate and comprises in the order given a base, a photopolymer layer, a barrier layer wherein the main component is a polymer different from gelatin, and an ink receiving layer wherein the main component is gelatin. An image having a high optical density can be printed on the ink receiving layer by image-wise jetting a water-based ink because the gelatin in the ink receiving layer has excellent ink receptivity and because the barrier layer reduces diffusion of monomers from the photopolymer layer to the ink receiving layer. The image present in or on the ink receiving layer can then be used as a photomask for the subsequent flood exposure of the photopolymer layer. After processing, a flexographic printing plate is obtained.

10 Claims, No Drawings

FLEXOGRAPHIC PRINTING PLATE PRECURSOR COMPRISING AN INK-JET RECEIVING LAYER

This application claims benefit of Prov. No. 60/147,381 filed Aug. 6, 1999.

FIELD OF THE INVENTION

The present invention relates to a material that is suitable for making a flexographic printing plate. More specifically the invention is related to a material which comprises a photopolymer layer and an ink receiving layer whereon ink can be jetted image-wise so as to obtain a mask for subsequent flood exposure of the photopolymer layer.

BACKGROUND OF THE INVENTION

Flexographic printing plates typically comprise a base and a photopolymer layer which is cured by image-wise exposure to (UV) light. During a subsequent processing step, the unexposed areas are removed by a developing liquid and a relief plate is obtained wherein the printing areas are raised above the surrounding non-printing areas. The relief image distinguishes flexography from other printing techniques such as lithography (planographic process wherein printing and non-printing areas are part of the same surface) and gravure (printing areas are recessed below the level of the non-printing areas).

Image-wise exposure of a flexographic plate is generally obtained by flood exposure of the photopolymer layer through a contact mask which is typically a film negative that is transparent in printing areas and opaque in the non-printing areas. Film production can be avoided by direct imaging of computer data onto flexographic plates by means of a digitally controlled imaging unit, e.g. a laser scanning apparatus. Such computer-to-plate methods are becoming a major trend in the art. The associated plates are often called digital plates.

WO 97/00777, U.S. Pat. No. 4,555,471, EP-A 487 260 and EP-A 491 457 describe digital plates comprising in the order given a base, a photopolymer layer, a peelable support and an image recording layer. After exposure to heat or light, e.g. by means of a laser or thermal head, and optional processing, an image is formed in the recording layer which can be used as a mask for exposure of the photopolymer layer. After flood UV-exposure through the mask, the support and the recording layer are peeled off and the photopolymer layer can be processed. For easy removal, the support can be silicon-coated or adhered to the photopolymer layer by a peelable adhesive as described in WO 97/00777. The image recording layer of such digital flexographic plates can be an ablative layer comprising a heat- or light-sensitive compound, e.g. a metal, a dye or a pigment such as carbon black. Typical ablative systems are described in WO 94/03838, WO 96/016356, EP-A 720 057, EP-A 741 330, EP-A 767 407 and U.S. Pat. No. 5,654,125. Other suitable image recording layers are thermochromic systems (U.S. Pat. No. 4,555,471), heat-developable photosensitive compositions containing an organic silver salt, a silver halide and a reducing agent (EP-A 509 740, EP-A 530 674, U.S. Pat. No. 5,258,282, EP-A 491 457), or can be based on heat-induced coalescence of metal particles (EP-A 875 889 and references therein).

A disadvantage of the digital plates which are described above is the low pliancy due to the presence of two supports : the base of the photopolymer layer and the peelable support of the image recording layer. As a solution, an image recording layer which dissolves in the processing liquid can be applied directly on the photopolymer layer. Examples of such plates are described in U.S. Pat. No. 4,288,528, EP-A 767 407, EP-A 741 330 and EP-A 720 057. An additional barrier layer can be provided between the photopolymer layer to prevent diffusion of monomers from the photopolymer layer to the image recording layer, as described in WO 94/03838, WO 94/03839 and U.S. Pat. No. 5,654,125.

EP-A 465 949 describes methods wherein toner, pigment or ink is image-wise transferred by electrophotography, thermal transfer or ink-jet directly onto the photopolymer layer of a flexographic plate so as to obtain a mask that is suitable for flood (UV-)exposure. DE-A 41 17 127 describes a similar process wherein an additional barrier layer, which simultaneously acts as an ink receiving layer, is present on top of the photopolymer layer. Said layer has two functions : preventing the diffusion of monomers from the photopolymer layer to the image recording layer and accepting the ink which is applied image-wise to obtain a mask. Especially when water-based inks are used, it is necessary that monomer diffusion is reduced effectively because the presence of such monomers in the ink receiving layer decreases the hydrophilicity of said layer and, as a result, reduces the ink receiving capability. A number of polymers are indicated in DE-A 41 17 127 for use as a binder of such a barrier/ink-receiving layer. The polymers that provide the best ink receiving properties, such as gelatin, actually have inferior barrier properties. Vice-versa, the polymers that provide good barrier capability, such as polyamides, have poor ink receptivity, i.e. the optical density of the jetted water-based ink is too low. This problem is not recognised in DE-A 41 17 127 and a fortiori not solved.

SUMMARY OF THE INVENTION

It is an object of the present invention to provide an improved material which is suitable for making a flexographic printing plate by ink-jet methods in a convenient way. More specifically, it is an object of the present invention to provide a material which is characterised by a high receptivity of water-based ink so that an exposure mask can be applied having a high optical density with regard to the light that is used for flood exposure of the photopolymer layer. It is a further object of the present invention to provide a material which retains its high receptivity of water-based ink during storage. This object is realised by the material having the specific features defined in claim 1. Specific features for preferred embodiments of the invention are disclosed in the dependent claims.

Further advantages and embodiments of the present invention will become apparent from the following description.

DETAILED DESCRIPTION OF THE INVENTION

In ink-jet printing tiny drops of ink fluid are deposited directly onto an ink receptor surface without physical contact between the printing device and the receptor by means of an image-wise controllable drop-ejection device called print head. In the method of the present invention, the known continuous ink-jet printing methods as weld as drop-on-demand methods such as piezo-electric ink-jet or the so-called "bubble-jet" and "thermal jet" methods can be used for jetting a water-based ink image-wise on the surface of the material of the present invention. Said material is a flexographic printing plate precursor and comprises in the order given a base, a photopolymer layer, a barrier layer and an ink receiving layer. That image thus obtained can then be used as a photomask for the subsequent flood exposure of the photopolymer layer. After washing out the unexposed areas with a suitable solvent, a relief image is developed which can be used as a print master for flexographic printing.

The specific advantages of the present invention are obtained by using a polymer different from gelatin as main component of the barrier layer and by using gelatin as main component of the ink receiving layer. The feature "main component" is generally understood as a component present in an amount which is not less than 50% of the total weight of the layer. In a preferred embodiment the ink receiving layer contains not less than 75% and even more preferably not less than 90% of gelatin. Gelatin forms a clear, hydrophilic coating which is characterised by a high absorption of water-based inks thereby providing rapid drying characteristics of the ink. The drying mechanism typically involves absorption by the ink receiving layer, penetration into said layer and evaporation.

The optimal composition of the water-based ink used in the method of the present invention is dependent on the specific ink-jet method used. In addition, the spectral absorption of the ink is preferably adjusted to the wavelength of the light used during exposure of the photopolymer layer through the jetted photomask. Ink compositions that are suitable for the method of the present invention typically include the following ingredients:dyes or pigments, water, moistening agents such as glycols, detergents, thickeners, polymeric binders, and preservatives.

Water-based inks typically contain about 75–90 weight % of water. In order to avoid dry tipping on the orifice of the printing head, they may contain a so-called humectant or mixtures of humectants which usually are (poly)alcohols. Suitable humectants include glycols such as diethyleneglycol, glycerine and polyethyleneglycol, N-methyl-pyrrolidone, 2-pyrrolidone, N-methyl-2-pyrrolidone, isopropanol, and 1,2-dimethyl-2-imidazolidone. Certain humectants such as N-methyl-pyrrolidone and 2-pyrrolidone have been found to improve the solubility of the colorant in the ink and thus serve the dual role as humectant and as co-solvent. Typically these humectants are present in a concentration ranging from 5 to 15%.

Apart from the colorant, water and humectant water-based ink compositions may contain minor amounts of other ingredients such as surfactants, biocides, buffering agents, chelating agents and defoaming agents.

The colorant in the ink used in the present invention is preferably a black pigment, e.g. carbon black in a concentration of at least 2%, preferably about 5%. Multiple types of inks containing carbon black are commercially available. They include carbon blacks such as Regal 400R, Mogul L, Elftex 320 from Cabot Co., or Carbon Black FW18, Special Black 250, Special Black 350, Special Black 550, Printex 25, Printex 35, Printex 55, Printex 150T from Degussa Co., and Pigment Black 7. Additional suitable pigments are disclosed in *Industrial Organic Pigments, Production, Properties, Applications* (second edition, W. Herbst, K. Hunger; VCH, 1997) and in U.S. Pat. No. 5,389,133 and U.S. Pat. No. 5,713,988.

The pigment particles should be sufficiently small to permit free flow of the ink through the ink-jet printing device, especially at the ejecting nozzles of the print head that usually have a diameter ranging from less than 10 microns to 50 microns. The pigment particle size also has an influence on the pigment dispersion stability, which is critical throughout the life of the ink. It is also desirable to use small particles for maximum color strength.

Accordingly, the average particle diameter may be from about 0.005 $\mu$m to about 15 $\mu$m. Preferably, the pigment particle size may range from about 0.005 to about 5 $\mu$m, more preferably from about 0.005 to about 1 $\mu$m, and most preferably from about 0.005 to about 0.3 $\mu$m. Pigment particle sizes outside these ranges may, of course, be used as long as the objectives of the present invention are achieved.

Very fine dispersions of pigments and methods for their preparation are disclosed in e.g. EP 0 776 952, U.S. Pat. No. 5,538,548, U.S. Pat. No. 5,443,628, EP 0 259 130, U.S. Pat. No. 5,285,064, EP 0 429 828, and EP 0 526 198.

When the pigment chosen is not in itself sufficiently absorptive in the UV spectral region it is preferred to add a UV absorbing dye to the ink composition. Suitable UV absorbers are disclosed e.g. in EP 0 252 550, U.S. Pat. No. 4,311,787, U.S. Pat. No. 4,082,554, U.S. Pat. No. 4,053,315, EP 0 519 306, EP 0 524 593, EP 0 524 594, EP 0 529 737, JP-A 03-38636, JP-A 03-13936, JP-A 03-41442, DE 4142935, EP 0 552 010, JP-A 03-48234, U.S. Pat. No. 5,155,015, EP 0 525 445, WO 93/5443, JP-A 03-78741, WO 93/13458, U.S. Pat. No. 4,923,788, EP 0 411 819, JP-A 61-205934, JP-A 01-259358, JP-A 02-73343, JP-A 02-71261 and EP 0 495 406. Still other UV absorbers are mentioned in Research Disclosure, December 1989, Item 309119, Section VIII.

Even when the pigment itself is a good UV absorber, as it is the case with carbon black, it is useful to add a UV absorber in order to enhance the UV density of the finished ink-jet image. By doing so the use of very high concentrations of carbon black which potentially could lead to sendimentation and nozzle clogging can be avoided.

Although gelatin is the main component of the ink receiving layer in the material of the present invention, other polymers may be used as an additional binder of said ink receiving layer. Especially nitrogen-containing polymers are preferred, e.g. polyvinyl pyrrolidone, polyacrylamide, acrylamide/ acrylic acid, poly(2-acrylamido-2-methyl propane sulphonic acid), poly(diethylene triamine-co-adipic acid), polyvinyl pyridine, polyvinyl imidazole, polyimidazoline quaternized, polyethylene imine, polyethylene imine epichlorohydrine modified, polyethylene imine ethoxylated, poly(N,N,-dimethyl-3,5-dimethylene piperidinium chloride, polyurethane, melamin resins, urea resins, nitrile rubbers, or albumin.

In principle, although not being a preferred embodiment, a non-N-containing binder may also be present in the receiving layer, e.g. cellulose derivatives such as carboxymethyl cellulose, hydroxyethyl cellulose, hydroxypropyl cellulose, hydroxypropyl methyl cellulose, starch, dextran, polyvinyl alcohol, polyvinyl alcohol derivatives such as acetoacetylated derivatives, polyvinyl acetate, polyvinyl acetal, polyalkyleneoxides, latices such as copoly(styrene-butadiene), carboxylated polymers or polyacrylates.

The receiving layer can further contain organic or inorganic fillers and porous particulate material. Inorganic materials include e.g. synthetic silica, talc, clay, koalin, diatomaceous earth, calcium carbonate, magnesium carbonate, aluminum hydroxide, aluminum oxide, boehmite and pseudo-boehmite, titanium oxide, zinc oxide, barium sulfate, calcium sulfate, zinc sulfide, satin white, aluminum silicate, calcium silicate, lithopone, etc. Organic materials include e.g. polystyrene, polymethacrylate, polymethylmethacrylate, elastomers, ethylene-vinylacetate copolymers, polyesters, polyester-copolymers, polyacrylates polyvinylethers, polyamides, polyolefines, polysilicones, guanamine resins, polytetrafluoroethylenes, elastomeric styrene-butadiene rubber (SBR), elastomeric butadiene-acrylonitrile rubber, urea resins or urea-formalin resins.

Further typical and useful ingredients of the ink-jet receiving layers of the present invention are so-called mordanting agents which by fixing the colorant of the jetted ink composition strongly improve the water-fastness of the finished image. Such mordants are e.g. (co)polymers containing cationic functions such as quaternary ammonium groups, fosfonium, sulfonium, and guadinium groups as disclosed in U.S. Pat. No. 4,371,582, U.S. Pat. No. 4,575,465, U.S. Pat. No. 4,649,064, GB 2210071, EP 423829, DE 3109931, U.S. Pat. No. 4,585,724, EP 295338, EP 306564, U.S. Pat. No. 5,314,747, EP 609930, WO 94/20304, WO 94/20305, WO 94/20306, EP 615853, EP 615884, and EP 618214. Also inorganic mordants have been described e.g. in U.S. Pat. No. 5,560,996, EP 704316 and EP 754560.

In a highly preferred embodiment, the ink receiving layer of the present invention also comprises a plasticizer such as ethylene glycol, dietylene glycol, propylene glycol, polyethylene glycol, glycerol monomethylether, glycerol monochlorohydrin, ethylene carbonate, propylene carbonate, tetrachlorophthalic anhydride, tetrabromophthalicanhydride, urea phosphate, triphenylphosphate, glycerolmonostearate, propylene glycol monostearate, tetramethylene sulfone, N-methyl-2-pyrrolidone, N-vinyl-2-pyrrolidone, and polymer latices with low Tg value such as polyethylacrylate or polymethylacrylate.

Surfactants may be incorporated in the ink-receptive layer of the present invention. They can be any of the cationic, anionic, amphoteric, and nonionic ones as described in JP-A 62–280068 (1987). Examples of the surfactants are N-alkylamino acid salts, alkylether carboxylic acid salts, acylated peptides, alkylsulfonic acid salts, alkylbenzene and alkylnaphthalene sulfonic acid salts, sulfosuccinic acid salts, olefin sulfonic acid salts, N-acylsulfonic acid salts, sulfonated oils, alkylsulfonic acid salts, alkylether sulfonic acid salts, alkylallylethersulfonic acid salts, alkylamidesulfonic acid salts, alkylphosphoric acid salts, alkyletherphosphoric acid salts, alkylallyletherphosphoric acid salts, alkyl and alkylallylpolyoxyethylene ethers, alkylallylformaldehyde condensed acid salts, blocked polymers having polyoxypropylene, polyoxyethylene polyoxypropylalkylethers, polyoxyethyleneether of glycolesters, polyoxyethyleneether of sorbitanesters, polyoxyethyleneether of sorbitolesters, polyethyleneglycol aliphatic acid esters, glycerol esters, sorbitane esters, propyleneglycol esters, sugaresters, fluoro $C_2$–$C_{10}$alkylcarboxylic acids, disodium N-perfluorooctanesulfonyl glutamate, sodium 3-(fluoro-$C_6$–$C_{11}$-alkyloxy)-1-$C_3$–$C_4$ alkyl sulfonates, N-[3-(perfluorooctanesulfonamide)-propyl]-N, N-dimethyl-N-carboxymethylene ammonium betaine, fluoro-$C_{11}$–$C_{20}$ alkylcarboxylic acids, perfluoro $C_7$–$C_{13}$ alkyl carboxylic acids, perfluorooctane sulfonic acid diethanolamide, Li, K and Na perfluoro $C_4$–$C_{12}$ alkyl sulfonates, N-propyl-N-(2-hydroxyethyl)perfluorooctane sulfonamide, perfluoro $C_6$–$C_{10}$alkylsulfonamide propyl sulfonylglycinates, bis-(N-perfluorooctylsulfonyl-N-ethanolaminoethyl)phosphonate, mono-perfluoro $C_6$–$C_{16}$ alkyl-ethyl phosphonates, and perfluoroalkylbetaine.

The receiving layer can further contain a so-called "spacing agent" which is used here as equivalent to "matting agent" or "roughening agent". Said spacing agent is preferably hydrophilic. Useful examples are the different types of silica such as disclosed e.g. in U.S. Pat. No. 3,084,131, U.S. Pat. No. 4,892,591, U.S. Pat. No. 4,902,568, EP 379964, EP 423829, U.S. Pat. No. 5,165,973, EP 739747, EP 781666, EP 803374, EP 862510, Wo 97/20691; starch or modified starch particles such as disclosed in EP 445327, EP 480362, EP 524635; and the alkali-soluble beads of U.S. Pat. No. 4,906,560 and EP 0 584 407.

The ink receiving layer may consist of just a single layer or can be coated as a multiple layer pack, e.g. a double layer.

The polymer binders of the ink receiving layer are preferably not or only to a very small degree cross-linked so that the layer can be removed after flood UV exposure of the photopolymer layer simply by washing the material with cold or preferably warm water. Alternatively, the ink receiving layer may also be removed with the same processing liquid as used for developing the photopolymer layer.

The ink receiving layer can be covered by a protective foil, which is removed before ink-jetting the photomask. Useful foils include e.g. cellulose nitrate film, cellulose acetate film, polyvinylacetal film, polystyrene film, polyethylene terephthalate film, polycarbonate film, polyvinylchloride film or poly-α-olefin films such as polyethylene or polypropylene film. The thickness of such organic resin film is preferably comprised between 5 and 35 μm. In a most preferred embodiment of the present invention the protective foil is a polyethylene terephthalate film provided with a release layer such as a silicon coating or a peelable adhesive.

The image which is jetted to the ink receiving layer can be a screened image or a line pattern image or a combination of both. The use of the ink receiving layer described herein enables to obtain a photomask with a transmission optical density in the image areas of at least 3.0, preferably at least 3.5 and most preferably even higher than 3.9. Said transmission optical density is obtained at the same wavelength or wavelength range as the light used for the flood exposure of the photopolymer layer through the jetted photomask. When the flood exposure is not carried out with monochromatic light but with a wavelength range, then said transmission optical density is the average density within said wavelength range.

The material of the present invention also comprises a transparent barrier layer between the photopolymer layer and the ink receiving layer. This barrier layer reduces diffusion of monomers from the photopolymer layer to the ink receiving layer, so that the hydrophilic character of said ink receiving layer remains intact during storage. Preferred polymers for use as a barrier are polyamides or copolyamides, e.g. those obtained from bifunctional carbonic acids such as adipinic acid and diamines or ω̄-amino acids, lactams or derivates thereof, e.g. nylon 3, 4, 5, 6, 8, 11, 12, 13, 6.6, 6.10 or 6.13; metaxylene diamine; trimethyl-hexamethylene diamine;isophoron diamine; 4,4-diamine-dicylcohexylmethane; or the N-methylol or N-alkoxymethyl derivatives of these homo- and copolyamides. Highly preferred barrier polymers are hydroxyalkylcellulose (alkyl being preferably ethyl or propyl) and fully or partially hydrolysed polyvinyl alcohol) alkanecarboxylate esters such as poly(vinyl acetate) or poly(vinyl propionate) having an hydrolysis grade of 88 to 98%. Such hydrophilic barrier layers can be removed with water simultaneously while washing away the ink receiving layer. An example of another highly preferred barrier polymer, which dissolves very well in a typical processing liquid used for processing the photopolymer layer such as Nylosolv II (available from BASF), is poly(vinyl butyraldehyde).

The photopolymer layer of the material of the present invention comprises the compositions known in the art of flexographic printing. Typical compositions are photosensitive to UV light having a wavelength in the range from 300 to 420 nm. In addition to the positive-working systems such as those based on o-quinonediazide, the negative-working photopolymerisable and/or photocrosslinkable systems are preferred. Such systems typically comprise a monomer compound having at least one reactive vinyl group in its molecule. The reactive vinyl group in these compounds includes substituted or unsubstituted vinyl groups having polymerization reactivity, as exemplified by styrene type vinyl groups, acrylic acid type vinyl groups, methacrylic acid type vinyl groups, allyl type vinyl groups, and vinyl ether type vinyl groups, as well as ester vinyl groups as in vinyl acetate.

Examples of the polymerizable polymer precursor satisfying such conditions may include, for example monofunctional monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, beta-chloroethyl vinyl ether, phenyl vinyl ether, p-methylphenyl vinyl ether, and p-chlorophenyl vinyl ether; difunctional monomers such as divinylbenzene, distyryl oxalate, distyryl malonate, distyryl succinate, distyryl glutarate, distyryl adipate, distyryl maleate, distyryl fumarate, distyryl beta,beta'-dimethylglutarate, distyryl 2-bromoglutarate, distyryl alpha, alpha'-dichloroglutarate, distyryl terephthalate, oxalic acid di(ethyl acrylate),oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), beta, beta'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), beta,beta'-dimethylglutaric acid di(ethyl methacrylate), 1,4-phenylenebis(oxyethyl methacrylate), and 1,4-bis(methacryloyloxyethoxy)cyclohexane, acryloyloxyethoxyethyl vinyl ether; trifunctional monomers such as pentaerythritol triacrylate, pentaerythritol trimethacrylate, pentaerythritol tri(hydroxystyrene), cyanuric acid triacrylate, cyarnuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethylacrylate), dipentaerythritol hexaacrylate, cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product pattern 1,1,1-trimethylolpropane and three-fold moles of hexanediisocyanate, with p-hydroxystyrene; and tetrafunctional monomers such as ethylenetetraacrylamide, and pylenetetraacrylamide. Two or more of these polymerizable polymer precursors can be used in combination.

The photopolymerization initiator used in the present invention may include, for example, carbonyl compounds, sulfur compounds, halogen compounds, photopolymerization initiators of redox type, and peroxide initiators sensitized with dye such as pyrilium. Specifically, the carbonyl compounds include diketones as exemplified by phenyl, 4,4'-dimethoxybenzyl, diacetyl, and camphorquinone; benzophenones as exemplified by 4,4'-bis(diethylamino) benzophenone, and 4,4'-dimethoxybenzophenone; acetophenones as exemplified by acetophenone, and 4-methoxyacetophenone; benzoin alkyl ethers; thioxanthones as exemplified by 2-chlorothioxanthone, 2,4-dichlorothixanthone, 2,4-diethylthioxanthone, and thioxanthone-3-carboxylic acid- beta -methoxy ethyl ester; chalcones and styrylketones having a dialkylamino group; and cumarins as exemplified by 3, 3'-carbonylbis(7-methoxycumarin), and 3,3'-carbonylbis (7-diethylaminocumarin). The sulfur compounds include disulfides as exemplified by dibenzothiazolyl sulfide, and decylphenyl sulfide. The halogen compounds include, for example, carbon tetrabromide, quinolinesulfonyl chloride, and S-triazines having a trihalomethyl group. The photopolymerization initiators of the redox type include those used in combination of a trivalent iron compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction. Such combination of the photopolymerization initiators includes a combination of styryl ketones or chalcones having a dialkylamino group or cumarins, with S-triazines having a trihalomethyl group or camphorquinone.

The photopolymer layer may contain additional ingredients such as a binder or film-forming agent, a solid solvent, a surfactant, an anti-static agent, a plasticiser to improve the flexibility of the material, a stabiliser to prevent monomers from premature crosslinking during storage, and a dye to permit easy inspection of the plate so that correct exposure and registration can be determined.

The binder or film-forming agent usable in the photopolymer layer may include, for example, cellulose esters, such as nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate; cellulose ethers, such as methyl cellulose, ethyl cellulose, propyl cellulose, and butyl cellulose; vinyl resins, such as polystyrene, polyvinyl chloride, polyvinyl acetate, polyvinyl butyral, polyvinyl acetal, polyvinyl alcohol, and polyvinyl pyrrolidone; copolymer resins, such as a styrene/butadiene copolymer, a styrene/acrylonitrile copolymer, a styrene/butadiene/acrylonitrile copolymer, and a vinyl chloride/vinyl acetate copolymer; acrylic resins, such as polymethyl methacrylate, polymethyl acrylate, polybutyl acrylate, polyacrylic acid, polymethacrylic acid, polyacrylamide, and polyacrylonitrile; polyesters, such as polyethylene terephthalate; polyarylate resins, such as poly(4,4'-isopropylidene, diphenylene-co-1, 4-cyclohexylenedimethylene carbonate), poly(ethylenedioxy-3, 3,-phenylene thiocarbonate), poly(4,4'-isopropylidene, diphenylene carbonate-co-terephthalate), poly(4,4'-isopropylidene,diphenylene carbonate), poly(4,4'-sec-butylidene,diphenylene carbonate), and poly(4,4'-isopropylidene,diphenylene carbonate-blockoxyethylene); plyamides; polyimides; epoxy resins; phenolic resins; polyolefins, such as polyethylene, polypropylene, and chlorinated polyethylene; and natural polymers, such as gelatin.

Highly preferred binders are elastomeric polymers such as polyalkadienes, vinylaromatic/alkadiene-copolymers and -blockcopolymers, alkadiene-acrylonitrile-copolymers, ethylene-propylene-copolymers, ethylene-propylene-alkadiene-copolymers, ethylene-(acrylic acid)-copolymers, alkadiene-(acrylic acid)-copolymers, alkadiene-acrylate-(acrylic acid)-copolymers and ethylene-((meth)acrylic acid)-(meth)acrylate-copolymers.

A specific photopolymer composition, which may be used in the material of the present invention, comprises an elastomer such as a rubber chosen for its specific hardness, e.g. polyisoprene, a monomer which undergoes radical-induced photopolymerisation, e.g. butanedioldiacrylate, and a photoinitiator such as benzildimethylketal which upon light absorption during the flood exposure step produces radicals that trigger the polymerisation reaction.

The base of the present material is preferably a dimensionally stable foil which is transparent in the wavelength range used for obtaining the so-called floor of the flexographic printing plate by back-exposure of the photopolymer layer. The same plastic resins as indicated above for the protective foil can be used. Poly(ethylene therephtalate) (PET) foil is a preferred example. Also metal sheets or metal-coated substrates are suitable as base of the material of the present invention. Typical examples are aluminum, steel or copper sheets. The base may be mechanically and/or chemically pre-treated or provided with an adhesive layer in order to ensure good adhesion to the photopolymer layer. Such an adhesive layer can consist, for example, of the conventional single- or two-component adhesives, e.g. those based on polyurethane. The base can further carry an antihalation layer below the photopolymer layer.

EXAMPLES

A Lumirror X43 PET film having a thickness of 125 $\mu$m (supplied by Toray Ind.) was provided with an ink receiving layer by coating an aqueous solution of a binder, as defined in table 1, which also contained 1 vol. % of a 5 wt. % aqueous solution of Akypo OP-80 (a surfactant supplied by Chemy) and 0.1 vol. % of a 5 wt. % aqueous solution of perfluoro-octanoic acid, ammonium salt. All samples thus obtained contained 8 g/m² of binder in the ink receiving layer. As indicated in table 1, some samples also contained an additional amount of silica particles (average diameter 3.5–5.0 $\mu$m).

A barrier layer was applied on top of the ink receiving layer by coating one of the following compositions so as to obtain a dry layer thickness of 3 $\mu$m

| Barrier layer A: | |
|---|---|
| Butvar B-79 (polybutyraldehyde from Monsanto) | 4.75 g |
| Palamoll 858 (an alifatic polyester plasticizer from BASF) | 0.25 g |
| methylethylketone | 45 g |

| Barrier layer B: | |
|---|---|
| Klucel L (hydroxypropylcellulose from Hercules) | 4.75 g |
| Santiciser 278 (a plasticizer from Monsanto) | 0.25 g |
| methanol | 45 g |

14 materials were thus prepared which all consisted of the Lumirror X43 PET base, an ink receiving layer as defined in table 1 and a barrier layer A or B (in the given order). Seven samples 1-A through 7-A comprised barrier layer A and seven samples 1-B through 7-B comprised barrier layer B. Seven more samples 1-X through 7-X which comprised no barrier layer but only an ink receiving layer were also prepared. This set of 21 materials is defined herein as (M-I).

Another set of 21 identical materials (M-II) was then obtained by peeling away the protective foil from a Nyloflex FAR 284 flexographic plate precursor (available from BASF), the latter material being composed of a PET base, a photopolymer layer, a polyamide barrier layer and said protective foil. The polyamide barrier layer was also removed from the photopolymer layer using a conventional adhesive tape.

Finally, 21 samples were prepared by laminating the coated side of materials (M-I) to the photopolymer layer of materials (M-II) using a laminator with heatable rollers at a temperature of 40° C. The samples 1-A, 5-A, 6-A, 7-A, 1-B, 5-B, 6-B, 7-B are materials according to the present invention.

After delaminating the Lumirror foil from the ink receiving layer, the samples were provided with a photomask by jetting a test image consisting of image and non-image areas to the ink receiving layer using a water-based pigmented ink (cartridge HP51645A from Hewlett-Packard) and the HP890C ink-jet printer (also from Hewlett-Packard). The net value of the transmission optical density (t.o.d.) at 360 nm, obtained by substracting the t.o.d. of non-image areas from the t.o.d. of the image areas is given under the heading $\Delta D$ in table 1. $AD°$ in the fourth column indicates values obtained immediately after preparing the samples. The samples containing a gelatin receiving layer allowed to obtain a very high density $\Delta D°$, whereas the other samples either provided a low density or were not suitable as an ink receiving layer, resulting in unevenly spreaded or coagulated ink. The data in table 1 show that an increase of the optical density of the ink may be obtained by adding silica particles to the ink receiving layer.

Subsequently, the photopolymer layer of the eight samples according to the invention was exposed to UV light through the photomask, then the ink-jet receiving layer was washed away with water at a temperature of 38° C. and finally, the photopolymer layer was developed using Nylosolv II (available from BASF). High quality flexographic plates were obtained.

The $\Delta D$ values of samples 1-A, 7-A, 1-X and 7-X were also measured after storing the samples during three weeks at ambient conditions, then removing the protection foil and finally jetting the image. These values are indicated in the fifth column of table 1. The results indicate that the presence of the barrier layer is essential in order to preserve the ink receptivity of the material.

TABLE 1

| Sample | Binder in ink receiving layer | Barrier layer | ΔD° (no storage) | ΔD (after storage) |
|---|---|---|---|---|
| 1-A | gelatin (a) | A | 3.97 | 4.54 |
| 2-A | PVP (b) | A | (x) | |
| 3-A | PVP (c) | A | 1.43 | |
| 4-A | PVA (d) | A | (x) | |
| 5-A | gelatin (a) + 0.4 g/m² SiO₂ | A | 3.60 | |
| 6-A | gelatin (a) + 0.8 g/m² SiO₂ | A | 3.44 | |
| 7-A | gelatin (a) + 2.0 g/m² SiO₂ | A | 3.84 | 3.57 |
| 1-B | same as 1-A | B | 3.40 | |
| 2-B | same as 2-A | B | (x) | |
| 3-B | same as 3-A | B | (x) | |
| 4-B | same as 4-A | B | (x) | |
| 5-B | same as 5-A | B | 3.35 | |
| 6-B | same as 6-A | B | 3.56 | |
| 7-B | same as 7-A | B | 3.78 | |
| 1-X | same as 1-A | none | 3.13 | 1.37 |
| 2-X | same as 2-A | " | (x) | |
| 3-X | same as 3-A | " | 1.56 | |
| 4-X | same as 4-A | " | (x) | |
| 5-X | same as 5-A | " | 3.09 | |
| 6-X | same as 6-A | " | 3.45 | |
| 7-X | same as 7-A | " | 3.90 | 2.34 |

(a) 8 g/m² of Koeppf Type 16096
(b) 8 g/m² of Luviskol K30, a low molecular weight poly(vinyl pyrrolidone) from BASF
(c) 8 g/m² of Luviskol K90, a high molecular weight poly(vinyl pyrrolidone) from BASF
(d) 8 g/m² of Mowiol GE S97, a poly(vinyl alcohol) from Hoechst
(x) meaningful results could not be measured due to unevenly spreaded or coagulated ink.

What is claimed is:

1. A flexographic printing plate precursor comprising in the order given a base, a photopolymer layer, a barrier layer wherein the main component is a polymer different from gelatin, and an ink receiving layer wherein the main component is gelatin.

2. A flexographic printing plate precursor according to claim 1 which further comprises a peelable protective foil on top of the ink receiving layer.

3. A flexographic printing plate precursor according to claim 1 wherein the main component of the barrier layer is a hydroxyalkylcellulose, a poly(vinyl butyraldehyde), or a homo- or co-polyamide.

4. A flexographic printing plate precursor according to claim 1 wherein the amount of gelatin in the ink receiving layer is higher than 90% by weight.

5. A flexographic printing plate precursor according to claim 1 wherein the ink receiving layer further comprises a plasticiser.

6. A method for making a flexographic printing plate comprising the steps of
   (i) making a photomask consisting of image and non-image areas by image-wise jetting water-based ink to the ink receiving layer of the flexographic printing plate precursor defined in any of the previous claims;
   (ii) exposing the photopolymer layer to UV light through the photomask;
   (iii) processing the photopolymer layer using a developing solution, thereby removing the photopolymer layer at non-image areas;
   wherein the transmission optical density in the image areas of the photomask is at least 3.0, measured at the wavelength or wavelength range of the UV light.

7. A method according to claim 6 wherein the ink receiving layer is removed by washing the material with water before processing the photopolymer layer.

8. A method according to claim 6 wherein also the barrier layer is removed during the step of removing the ink receiving layer or during the step of processing the photopolymer layer.

9. A method according to claim 6 wherein the transmission optical density is at least 3.5.

10. A method according to claim 6 wherein the transmission optical density is at least 3.9.

* * * * *

UNITED STATES PATENT AND TRADEMARK OFFICE
CERTIFICATE OF CORRECTION

PATENT NO. : 6,358,668 B1
DATED : March 19, 2002
INVENTOR(S) : Luc Leenders et al.

It is certified that error appears in the above-identified patent and that said Letters Patent is hereby corrected as shown below:

<u>Column 2,</u>
Line 61, "weld" should read -- well.

<u>Column 9,</u>
Line 67, "3 µm" should read -- 3 µm: --.

<u>Column 12,</u>
Line 13, "plasticiser" should read -- plasticizer --.
Line 31, "claim 6" should read -- claim 7 --.

Signed and Sealed this

Third Day of September, 2002

*Attest:*

*Attesting Officer*

JAMES E. ROGAN
*Director of the United States Patent and Trademark Office*

UNITED STATES PATENT AND TRADEMARK OFFICE
Certificate

Patent No. 6,358,668 B1                                                                     Patented: March 19, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Luc Leenders, Herentals, Belgium; Eddie Daems, Herentals, Belgium; Ronn Andriessen, Beerse, Belgium; Leo Oelbrandt, Kruibeke, Belgium; Sabine Philipp, Bickenbach, Germany; and Alfred Leinenbach, Willstatt, Germany.

Signed and Sealed this Sixth Day of July 2004.

JANET C. BAXTER
*Supervisory Patent Examiner*
Art Unit 1752

United States Patent and Trademark Office
Certificate

Patent No. 6,358,668 B1                                                                       Patented: March 19, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Luc Leenders, Herentals, Belgium; Eddie Daems, Herentals, Belgium; Ronn Andriessen, Beerse, Belgium; Leo Oelbrandt, Kruibeke, Belgium; Sabine Philipp, Bickenbach, Germany; and Alfred Leinenbach, Willstatt, Germany.

Signed and Sealed this Eighteenth Day of April 2006.

CYNTHIA H. KELLY
*Supervisory Patent Examiner*
Art Unit 1752